(12) United States Patent
Anelle et al.

(10) Patent No.: US 7,814,110 B2
(45) Date of Patent: Oct. 12, 2010

(54) METHODS AND SYSTEMS FOR INTERROGATING DATA ATTRIBUTES IN A PROCESS ENVIRONMENT

(75) Inventors: Joseph Anelle, Weldon Spring, MO (US); Robert J. Schreiber, Kirkwood, MO (US); Jennifer Theisen, St. Charles, MO (US)

(73) Assignee: The Boeing Company, Chicago, IL (US)

( * ) Notice: Subject to any disclaimer, the term of this patent is extended or adjusted under 35 U.S.C. 154(b) by 226 days.

(21) Appl. No.: 11/614,741

(22) Filed: Dec. 21, 2006

(65) Prior Publication Data

US 2008/0155432 A1 Jun. 26, 2008

(51) Int. Cl.
*G06F 17/50* (2006.01)
(52) U.S. Cl. ..................... 707/754; 707/805
(58) Field of Classification Search ............... 707/754, 707/805
See application file for complete search history.

(56) References Cited

U.S. PATENT DOCUMENTS

| | | | |
|---|---|---|---|
| 5,070,483 A * | 12/1991 | Berni | 367/14 |
| 5,828,579 A * | 10/1998 | Beausang | 716/2 |
| 6,289,254 B1 * | 9/2001 | Shimizu et al. | 700/96 |
| 6,519,603 B1 * | 2/2003 | Bays et al. | 707/102 |
| 6,901,442 B1 * | 5/2005 | Schwaller et al. | 709/224 |
| 7,392,255 B1 * | 6/2008 | Sholtis et al. | 707/203 |
| 2002/0183982 A1 | 12/2002 | Rauscher | |
| 2003/0078676 A1 | 4/2003 | Kuribayashi et al. | |
| 2006/0071754 A1 * | 4/2006 | Tofts et al. | 340/5.22 |

\* cited by examiner

*Primary Examiner*—James Trujillo
*Assistant Examiner*—Fatima P Mina
(74) *Attorney, Agent, or Firm*—Harness, Dickey & Pierce, P.L.C.

(57) ABSTRACT

A computer program product and method for interrogating data attributes in a product development environment is provided. In one embodiment, a computer program product includes a product development application that includes an interrogate data selection device. A product development datastore stores attribute data associated with at least one of a part item and an annotation item created by the product development application. A data interrogator module is initiated by the interrogate data selection device and retrieves the attribute data associated with at the least one of the part item and the annotation item from the product development datastore. A graphical user interface manager module displays the attribute data in a user customizable presentation.

13 Claims, 10 Drawing Sheets

METHODS AND SYSTEMS FOR INTERROGATING DATA ATTRIBUTES IN A PROCESS ENVIRONMENT

FIELD

The present disclosure relates to computer program products and methods for interrogating data attributes in a product development process environment.

BACKGROUND

The statements in this section merely provide background information related to the present disclosure and may not constitute prior art.

Automated design systems are used by designers and engineers to create circuits, devices, structures, or other items. One type of design system is a computer aided design (CAD) program. A CAD program for industrial design, for example, can be used to create a design of a structure such as a beam, mechanical system, mobile airborne platform part, automobile part, etc. As can be appreciated, different types of CAD systems can be used to create designs for any part or item.

As designs become more complex, the size of design data associated with each part or item can be large. For instance, each part may include a plurality of sub-parts. Each sub-part may include associated data attributes that define the part's dimensions, materials, etc. Accessing the data attributes in complex designs can be time consuming. For example, conventional CAD systems provide an expandable product tree structure for listing the parts, sub-parts, and associated attributes. Navigating this type of tree structure, where the tree requires expansion until a specific part is found, and then further expansion of this part to access the nodes that house the data attributes, is time consuming. Further, the expandable tree structure provides little or no means for filtering common data attributes.

Similarly, manufacturing design systems rely on the data associated with the parts, sub-parts, and data attributes to generate work instructions, process plans, etc. Accessing the plethora of data attributes via the manufacturing design systems can be just as time consuming. Thus, the need exists for a more efficient system that interrogates data attributes in a product development environment.

SUMMARY

In one embodiment, a computer program product for interrogating data attributes in a product development environment is provided. The computer program product includes a product development application that includes an interrogate data selection device. A product development datastore stores attribute data associated with at least one of a part item and an annotation item created by the product development application. A data interrogator module is initiated by the interrogate data selection device and retrieves the attribute data associated with the at least one of the part item and the annotation item from the product development datastore. A graphical user interface manager module displays the attribute data in a user customizable presentation.

In one implementation, a method of interrogating data attributes in a product development environment is provided. The method includes initiating an interrogation process graphical user interface based on an interrogate command received from at least one of a computer assisted design application and a manufacturing application; retrieving attribute data associated with at least one of a part item and an annotation item from a product development datastore; and displaying the attribute data in a user customizable presentation via the interrogation process graphical user interface.

In another embodiment, a product development system is provided. The system includes a computer aided design (CAD) application used for designing at least one part item and assigning attribute data to the at least one part item. The CAD application includes an interrogate attribute selection device. A datastore stores the at lest one part item and the attribute data. An interrogate data attribute module is initiated by the interrogate attribute selection device and interfaces with the CAD application to retrieve and display attribute data of the at least one part item from the datastore.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION OF THE PREFERRED EMBODIMENTS

Figure 1:
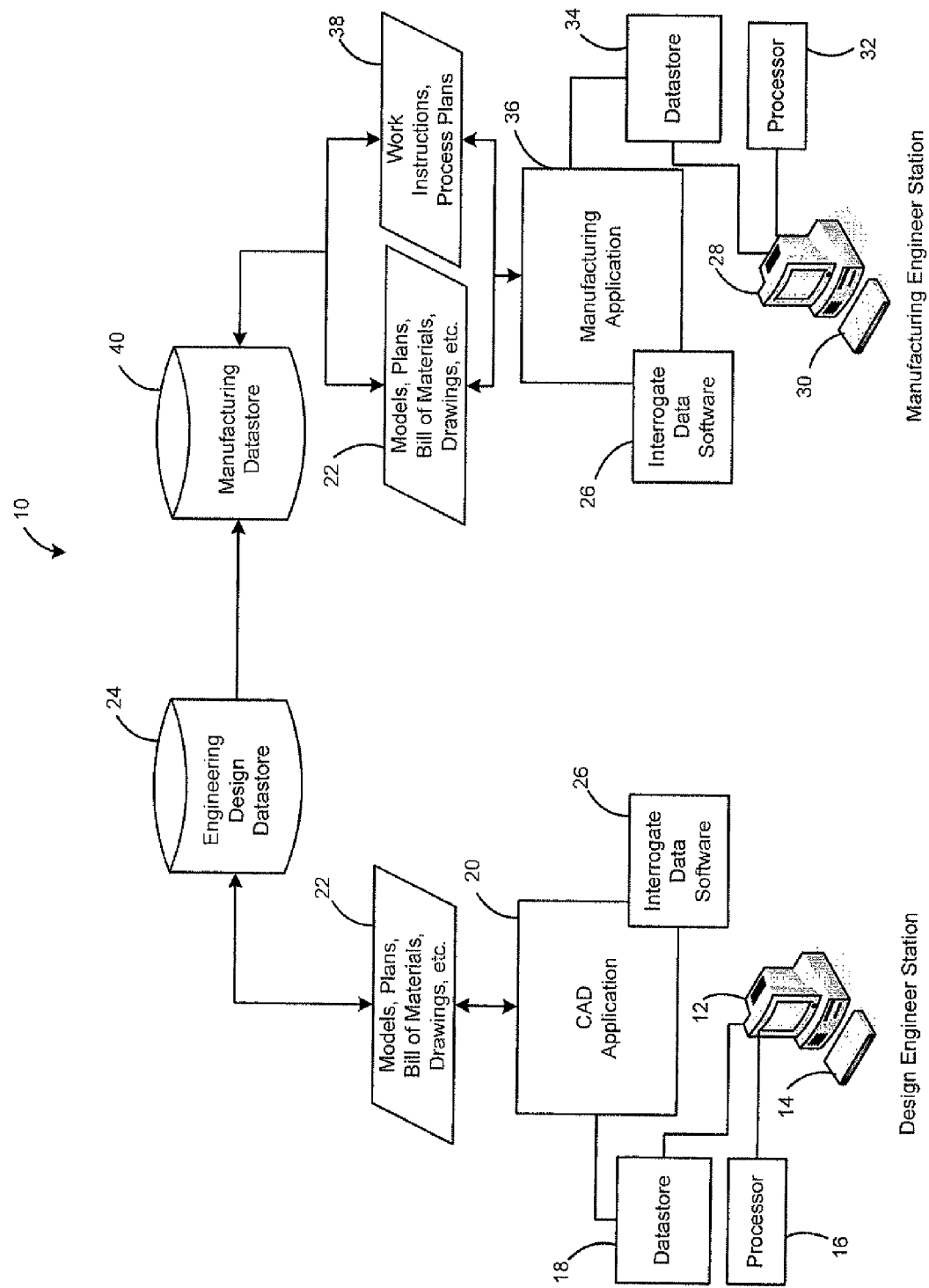
FIG. 1 illustrates a product development system including interrogate data software.

The following description is merely exemplary in nature and is not intended to limit the present disclosure, application, or uses. It should be understood that throughout the drawings, corresponding reference numerals indicate like or corresponding parts and features.

Referring now to FIG. 1, an exemplary product develop system is shown generally at 10. The product development system 10 is shown to include a first computer 12 that can be used as a design engineering station. The first computer 12 may be any computer system including, but not limited to, a laptop, a desktop, and a workstation. The first computer 12 can be associated with one or more input devices 14 used by a user to communicate with the first computer 12. As can be appreciated, such devices 14 may include, but are not limited to, a mouse, a keyboard, and a touchpad. The first computer 12 includes a processor 16 and one or more data storage devices 18. The one or more data storage devices 18 can be at least one of random access memory (RAM), read only memory (ROM), a cache, a stack, or the like which may temporarily or permanently store electronic data of the first computer 12.

The processor 16 of the first computer 12 is operable to execute one or more set of instructions contained in software. A product development application such as a computer aided design (CAD) software application 20 can be installed to the computer's data storage device 18 or run from a portable storage device such as a CD-ROM (not shown). In various other embodiments, the CAD application 20 can be downloaded via the internet (not shown) or run from a remote location such as from a remote server (not shown). The CAD application 20 accepts input from a user to generate design data 22 including, but not limited to, models, plans, bill of materials, drawings, etc. In various embodiments, the CAD application generates design data 22 pertaining to mobile airborne platforms. The design data 22 is stored in an engineering design datastore 24. The engineering design datastore 24 can reside on the first computer 12 or reside on a remote station such as a server (not shown).

The CAD application 20 includes interrogate data software 26 in accordance with the present disclosure. The interrogate data software 26 allows a user to interrogate design data attributes stored in the engineering design datastore 24 based on parts and annotations from the CAD application 20. As can be appreciated, the interrogate data software 26 can be a plug-in to existing CAD software applications 20 or a stand alone program.

Similarly, the product development system 10 can include a second computer 28 that can be used as a manufacturing engineering station. The second computer 28 may be any computer system including, but not limited to, a laptop, a desktop, and a workstation. The second computer 28 can be associated with one or more input devices 30 used by a user to communicate with the second computer 28. As can be appreciated, such devices 30 may include, but are not limited to, a mouse, a keyboard, and a touchpad. The second computer 28 includes a processor 32 and one or more data storage devices 34. The one or more data storage devices 34 can be at least one of random access memory (RAM), read only memory (ROM), a cache, a stack, or the like which may temporarily or permanently store electronic data of the second computer 28.

The processor 32 of the second computer 28 is operable to execute one or more set of instructions contained in software. A product development application such as a manufacturing software application 36 can be installed to the computer's data storage device 34 or run from a portable storage device such as a CD-ROM (not shown). In various other embodiments, the manufacturing application 36 can be downloaded via the internet (not shown) or run from a remote location such as a from a remote server (not shown). The manufacturing application 36 accepts input from a user to generate manufacturing data 38 including, but not limited to, work instructions, process plans, etc. In various embodiments, the manufacturing application 36 generates manufacturing data 38 pertaining to mobile airborne platforms. The manufacturing data 38 is stored in a manufacturing datastore 40. The manufacturing datastore 40 can reside on the second computer 28 or reside on a remote station such as a server (not shown).

The manufacturing application 36 includes the interrogate data software 26 as discussed above. The interrogate data software 26 allows a user to interrogate the design data 22 and or the manufacturing data 38 stored in the manufacturing datastore 40 or the engineering design datastore 24 based on parts and annotations used by the manufacturing application 36.

Figure 2:
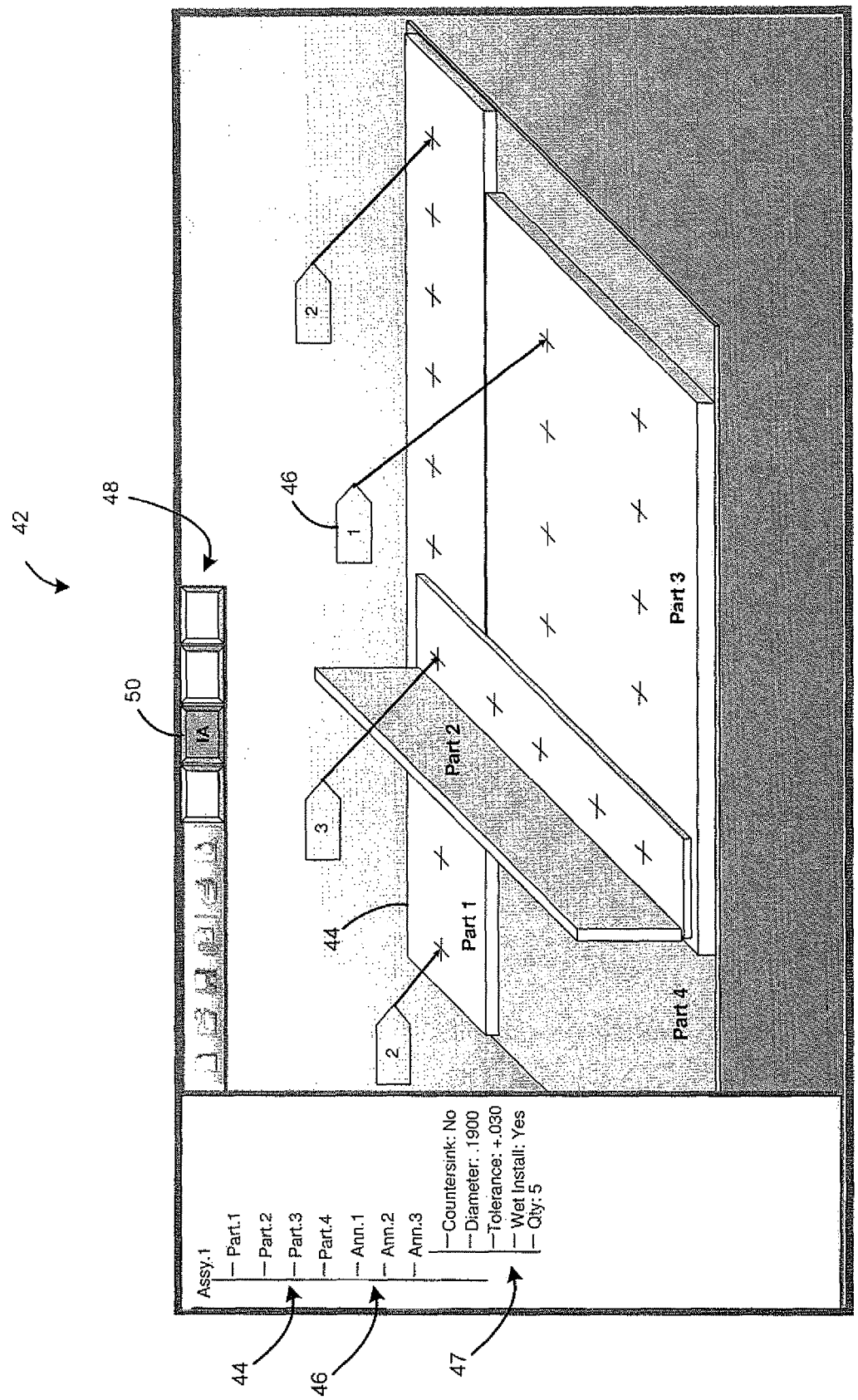
FIG. 2 is a graphical user interface illustrating an exemplary computer aided design application of the product development process that includes an option to initiate the interrogate data software.

Referring now to FIG. 2, a exemplary graphical user interface 42 illustrating the CAD application 20 (FIG. 1) of the product development system 10 (FIG. 1) is shown. As can be appreciated, the interrogate data attributes systems and methods of the present disclosure can similarly apply to the manufacturing application 36 of FIG. 1. As shown in FIG. 2, the CAD application graphical user interface 42 can display design data including part items 44, annotation items 46, and attributes 47 in various formats including a graphical two-dimensional format, a graphical three-dimensional format, and an expandable tree-structure format. In various embodiments, the CAD application graphical user interface 42 includes a toolbar 48. An interrogate attribute selection button 50 can be accessed via the toolbar 48. The interrogate attribute selection button 50, when selected, initiates an instance of an interrogate process graphical user interface 52 as will be discussed in the context of FIG. 3A. As can be appreciated, the interrogate process graphical user interface 52 (FIG. 3A) can be initiated via other selection devices including, but not limited to, a drop-down menu, a dialog box, and a selection icon.

Figure 3A:
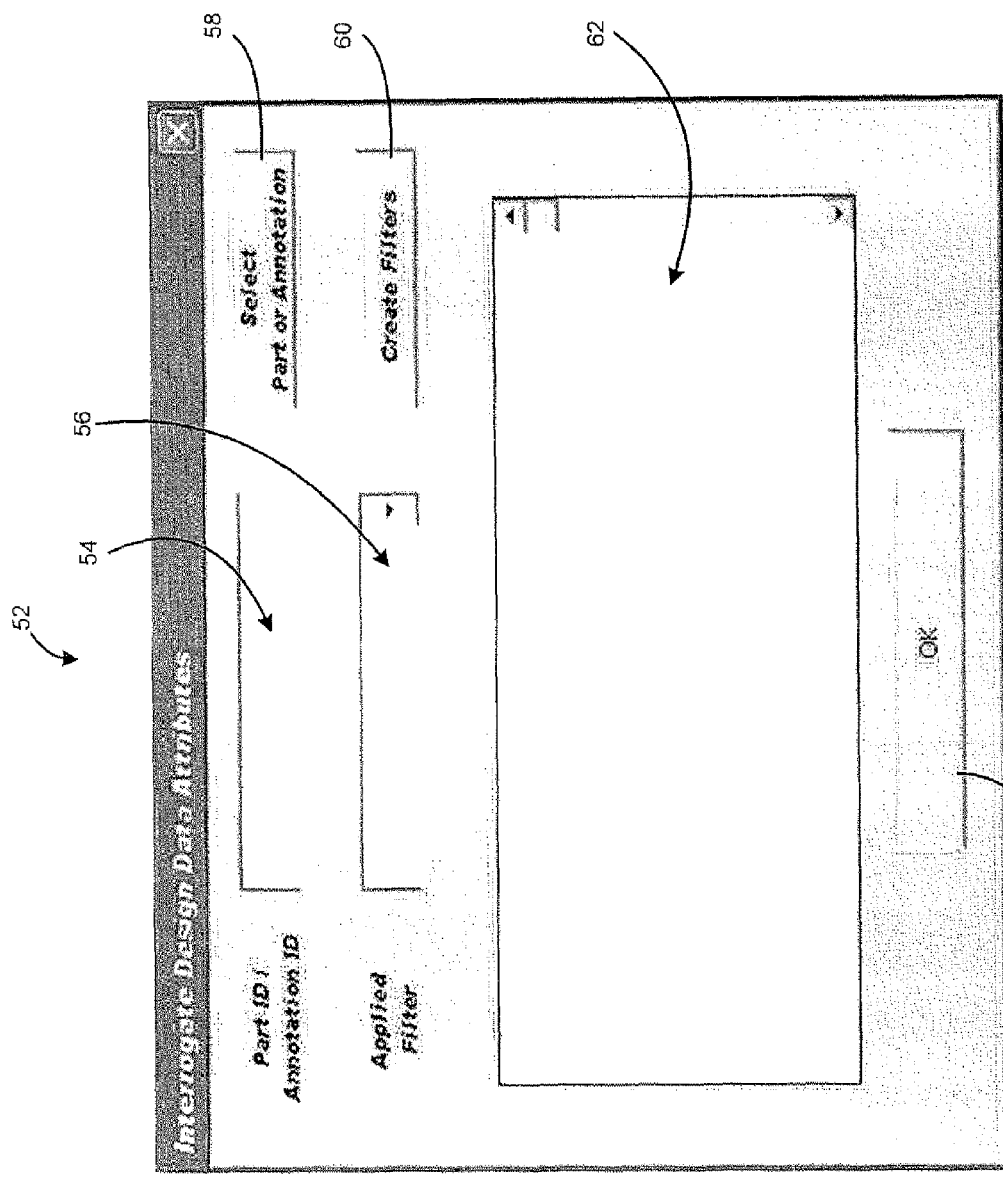
FIG. 3A illustrates an exemplary interrogate process graphical user interface generated by the interrogate data software.

Referring now to FIG. 3A, an exemplary interrogate process graphical user interface 52 is shown. The interrogate process graphical user interface 52 includes a part item text box 54, a filter text box 56, a part selection button 58, a create filters button 60, an attribute display screen 62, and an execute button 64. The part selection button 58, when selected, populates the part item text box 54 with the part item 44 or the annotation item 46. The part item 44 or the annotation item 46 can be selected from the CAD application graphical user interface 42, for example, by highlighting the selected part item 44. Alternatively, the part item 44 or the annotation item 46 can be manually entered into the part item text box 54.

The filter text box 56 includes a drop-down list of pre-defined filters. One or no filter can be selected from the list. To define a new filter, the create filters button 60 is provided. When selected, the create filters button 60 initiates an instance of a filter graphical user interface 70 as will be discussed in the context of FIG. 4A. Once the part item 44 or annotation item 46 is selected and the filter or no filter is selected, the execute button 64 can be selected. The execute button 64, when selected, causes the interrogate data software 26 to retrieve attributes associated with the part item 44 or annotation item 46 based on the filter (if provided). The attributes 47 are displayed in the attribute display screen 62.

Figure 3B:
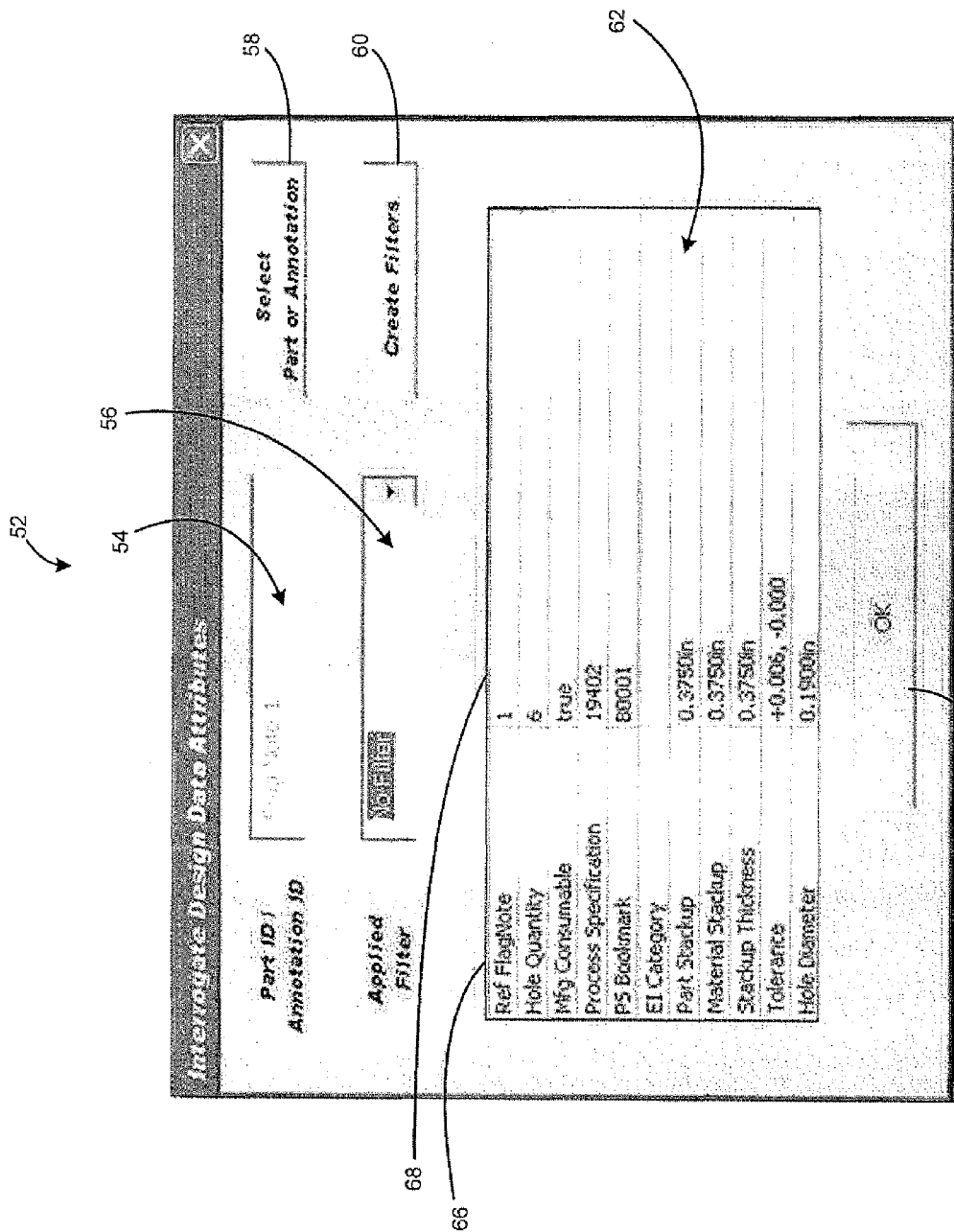
FIG. 3B illustrates an exemplary interrogate process graphical user interface including exemplary data.

FIG. 3B illustrates the exemplary interrogate process graphical user interface of FIG. 3A that is populated with exemplary data. As shown, the attributes 47 were retrieved for the "Flag Note 1" annotation corresponding to FIG. 2 with "No Filter" applied. The attribute display screen 62 displays the attributes 47 in a tabular format including an attribute label 66 and the associated attribute data 68. As can be appreciated, an export button (not shown) can be provided that, when selected, exports the attributes 47 from the interrogate process graphical user interface 52 to an attribute file 72 (shown in FIG. 6) according to a pre-defined format including, but not limited to, Extensible Markup Language (XML), Excel, tab separated variables (tsv), and comma separated variables (csv).

Figure 4A:
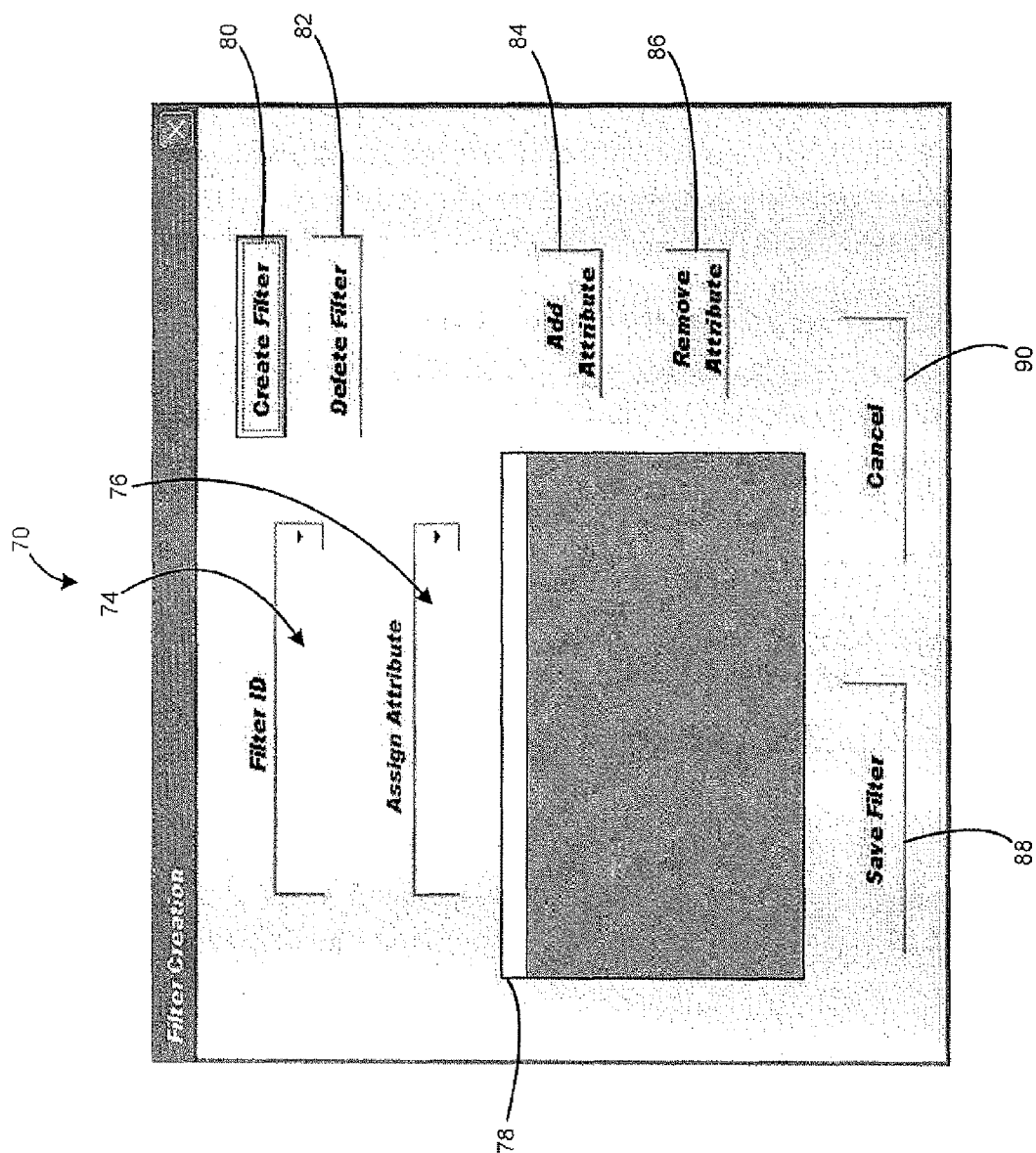
FIG. 4A illustrates an exemplary filter graphical user interface generated by the interrogate data software.

Referring now to FIG. 4A, an exemplary filter graphical user interface 70 is shown. The filter graphical user interface 70 includes a filter text box 74, an attribute text box 76, a filter attributes display screen 78, a create filter button 80, a delete filter button 82, an add attribute button 84, a remove attribute button 86, a save filter button 88, and a cancel button 90. The filter text box 74 includes a drop-down list indicating the pre-defined filters. A pre-defined filter can be selected from the drop-down list for customization such as modification or deletion. In addition, a new filter can be created by selecting the create filter button 80 and manually entering a new filter name into a text box. As can be appreciated, a separate dialog box (not shown) can appear that includes the text box for entering the new filter name. The attribute text box 76 includes an attribute list of available attributes 47 that can be associated with a part item 44 or annotation item 46. When selecting an attribute 47 from the attribute list, the attribute 47 can be added via the add attribute button 84 to the filter list and displayed in the filter attributes display screen 78. An attribute 47 can be removed from the filter list by selecting the attribute 47 from the filter attributes display screen 78 and selecting the remove attribute button 86. After creation, the filter can be saved via the save filter button 88 or deleted via the delete filter button 82. The cancel button terminates the filter graphical user interface 70 without saving the filter data.

Figure 4B:
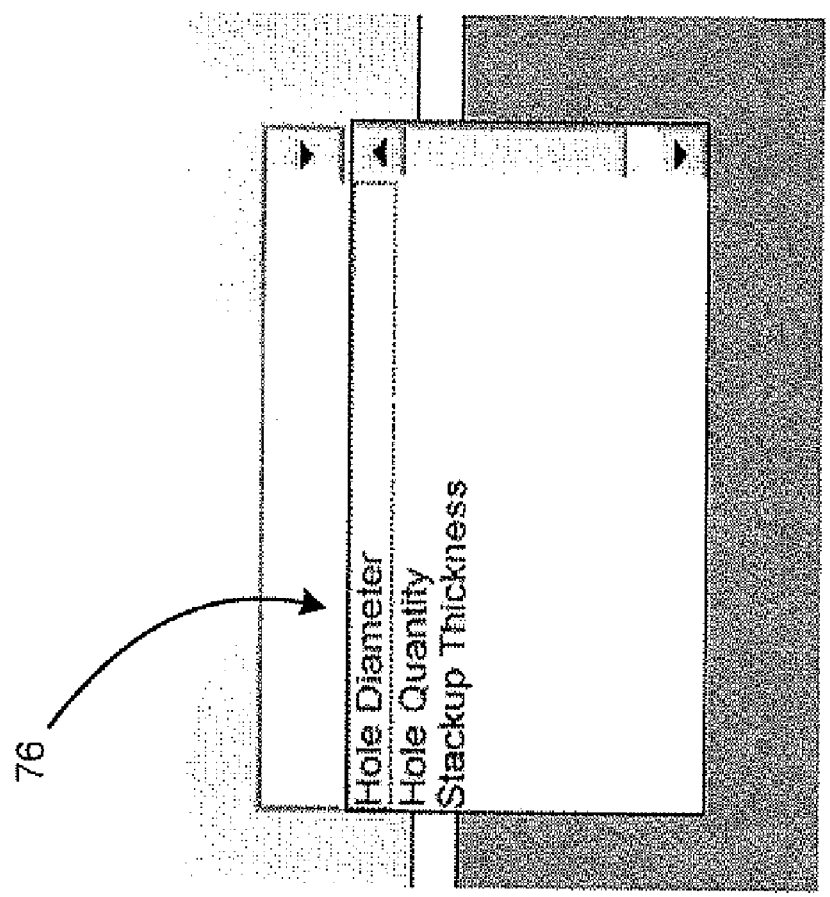
FIG. 4B illustrates a portion of an exemplary filter graphical user interface including exemplary available attribute data.
Figure 5:
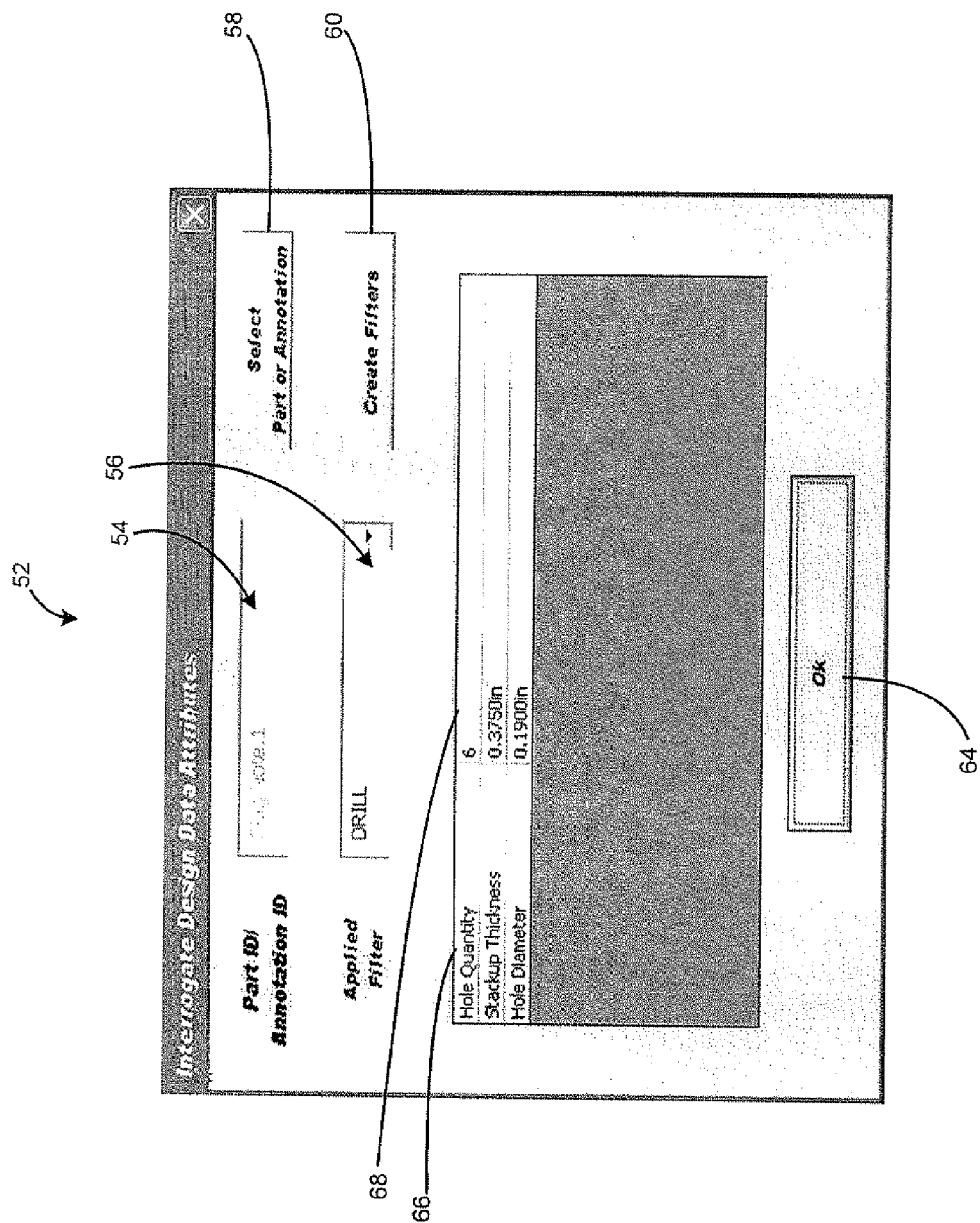
FIG. 5 illustrates an exemplary interrogate process graphical user interface including exemplary filtered data.

FIG. 4B illustrates a portion of the exemplary filter graphical user interface 70 of FIG. 4A populated with exemplary data. As shown, a filter can be created to include the following attributes: Hole Quantity, Stackup Thickness, and Hole Diameter. FIG. 5 illustrates the exemplary interrogate process graphical user interface 52 of FIG. 3A populated with exemplary data based on a "DRILL" filter including the above mentioned attributes.

Figure 6:
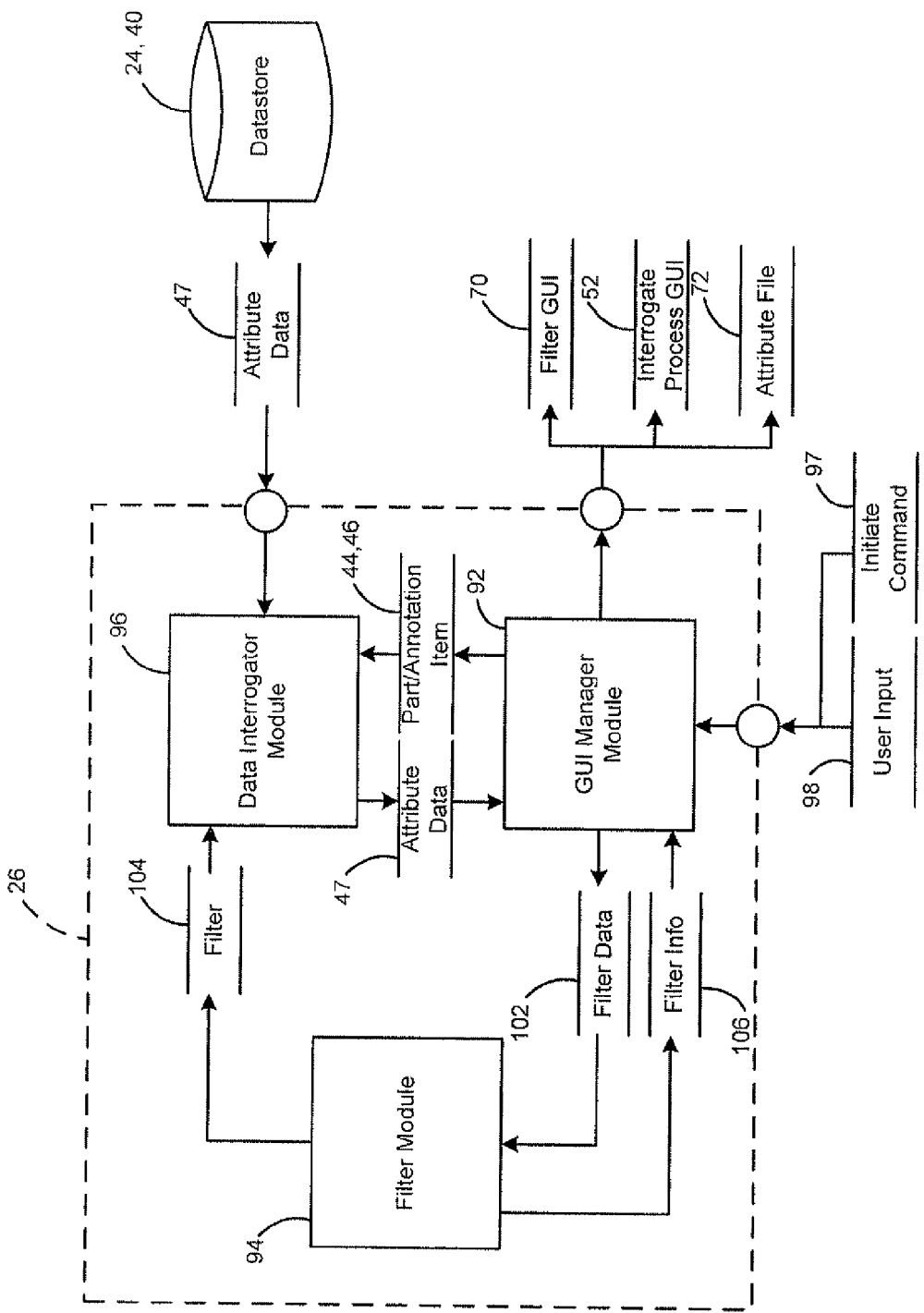
FIG. 6 is a dataflow diagram illustrating the interrogate data software in more detail.

Referring now to FIG. 6, an exemplary embodiment of the interrogate data software 26 is shown. As can be appreciated, the interrogate data software 26 can be used to interrogate data attributes by interfacing with the CAD application 20 or the manufacturing applications 36. In various embodiments, the interrogate data software 26 includes one or more software modules. As can be appreciated, the software modules shown in FIG. 6 may be combined and/or further partitioned to similarly interrogate data attributes 47. In the embodiment of FIG. 6, the interrogate data software 26 includes a graphical user interface manager module 92, a filter module 94, and a data interrogator module 96.

The graphical user interface manager module 92 displays and accepts input from the two graphical user interfaces 52 and 70. Upon receiving an initiate command 97 generated by the interrogate data button 50 (FIG. 2), the graphical user interface manager module 92 displays the interrogate process graphical user interface 52. Upon receiving user input 98 indicating a selection of the create filters button 60 (FIG. 3A), the graphical user interface manager module 92 displays the filter graphical user interface 70. A user interacts with the interrogate process graphical user interface 52 and the filter graphical user interface 70 to generate user input 98. The graphical user interface manager module 92 receives the user input 98 and directs the user input 98 in the form of a part/annotation item 44,46 or filter data 102 to the data interrogator module 96 and the filter module 94 respectively.

The data interrogator module 96 receives the part/annotation item 44,46 and retrieves attributes 47 associated with at least one of the part item 44 or the annotation item 46 from the datastore 24 or 40. The graphical user interface manager module 92 then displays the attributes 47 in the interrogate process graphical user interface 52. Additionally or alternatively, the graphical user interface manager module 92 can export the attributes 47 to an attribute file 72 according to a predefined format as discussed above. The filter module 94 receives the filter data 102 and generates a filter 104. The graphical user interface manager module 92 displays the filter information 106 in the filter graphical user interface 70. The filter 104 is then applied by the data interrogator module 96 when retrieving attributes 47 from the datastore 24 or 40.

Figure 7:
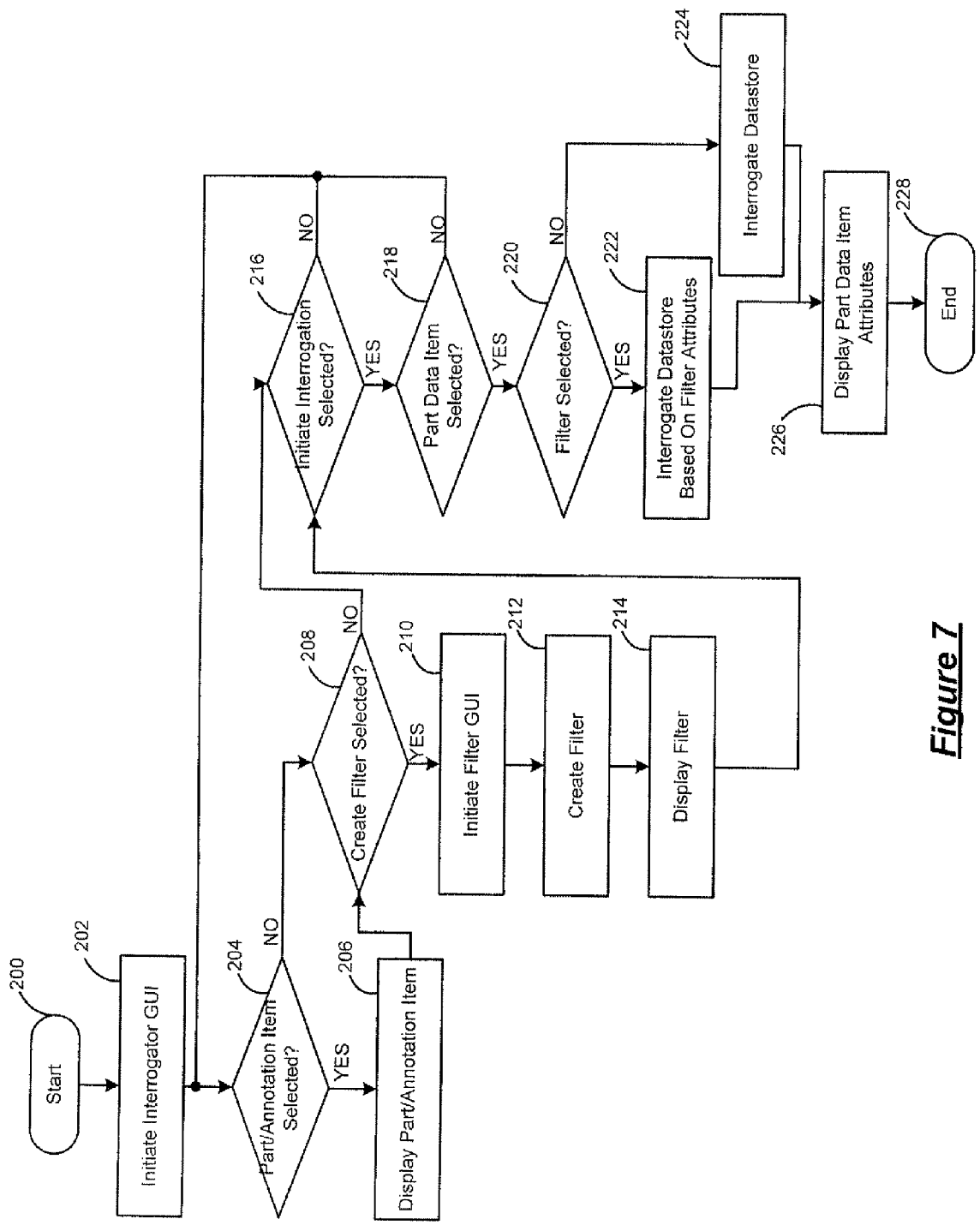
FIG. 7 is a process flow diagram illustrating an exemplary interrogate data method as performed by the interrogate data software.

Referring now to FIG. 7 and with continued reference to FIG. 6, a process flow diagram illustrating an exemplary interrogate data method as performed by the interrogate data software 26 is shown. As can be appreciated, operation of the interrogate data method can be executed in varying order and therefore is not limited strictly to the sequential execution as illustrated in FIG. 7. The method may begin at 200. The interrogate process graphical user interface 52 is initiated at operation 202. The user input 98 is evaluated at operations 204, 208, and 216. If the part item 44 or annotation item 46 is selected at operation 204, the part item 44 or annotation item 46 is displayed by the interrogate process graphical user interface 52 at operation 206. If create filter is selected at operation 208, the filter graphical user interface 70 is initiated at operation 210, the filter is created at operation 212, and the filter name is displayed in the interrogate process graphical user interface 52 at operation 214. Details of the create filter method as performed by the create filter operation 212 will be discussed further below.

If initiate interrogation is selected at operation 216, the part item 44 or annotation item 46 has been selected at operation 218, and the filter 104 has been selected at operation 220, the datastore 24 or 40 is interrogated for attributes 47 based on the part item 44 or annotation item 46 and the filter 104. The attributes 47 for that part item 44 or annotation item 46 are displayed in the interrogate process graphical user interface 52 at operation 226. Otherwise, if initiate interrogation is selected at operation 216, the part item 44 or annotation item 46 has been selected at operation 218, and no filter has been selected at operation 220, the datastore 24 or 40 is interrogated for attributes 47 based on the part item 44 or annotation item 46 and no filter is applied at operation 224. The attributes 47 for that part item 44 or annotation item 46 is displayed in the interrogate process graphical user interface 52 at operation 226. The method may end at 228.

Figure 8:
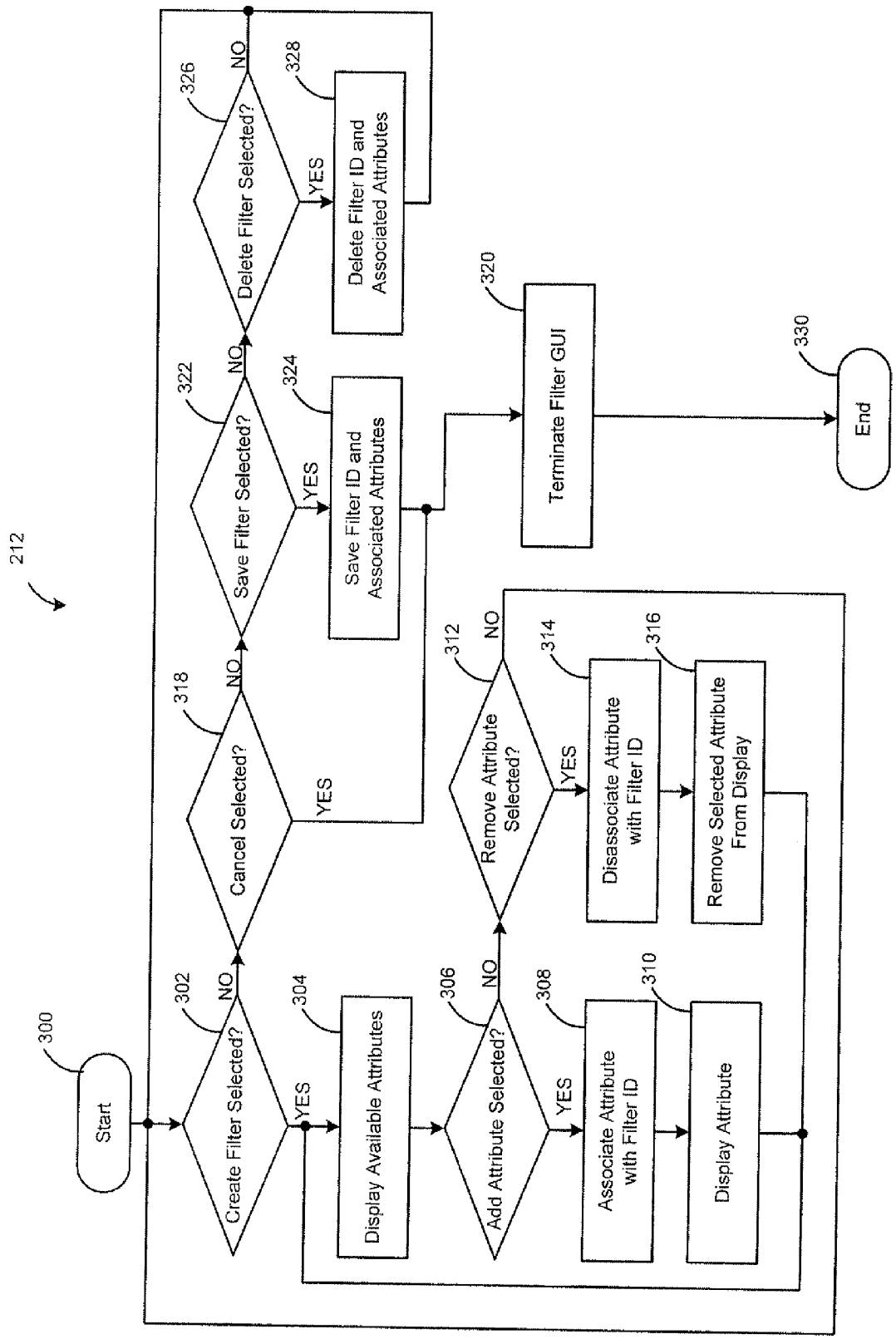
FIG. 8 is a process flow diagram illustrating an exemplary filter method as performed by a filter sub-module of the interrogate data software.

Referring now to FIG. 8 and with continued reference to FIG. 6, a process flow diagram illustrating an exemplary filter method as performed by the filter module 94 of the interrogate data software 26 is shown. As can be appreciated, operation of the filter method can be executed in varying order and therefore is not limited strictly to the sequential execution as illustrated in FIG. 8. The method may begin at 300. The user input 98 is evaluated at operations 302, 306, 312, 318, 322, and 326. If "Create Filter" is selected at operation 302, the list of available attributes is displayed at operation 304. If "Add Attribute" is selected at operation 306, the selected attribute 47 from the available attributes 47 is associated with the filter name at operation 308 and the attribute 47 is listed in the filter graphical user interface 70 at operation 310. Otherwise, if "Remove Attribute" is selected at operation 312, the selected attribute 47 is disassociated with the filter name at operation 314 and the attribute 47 is removed from the listing in the filter graphical user interface 70 at operation 316. Thereafter, the method loops back to evaluate the user input 98 at operation 302.

If "Cancel" is selected at operation 318, the filter graphical user interface 70 is terminated at operation 320 and the method may end at 330. If "Save Filter" is selected at operation 322, the filter name and associated attributes 47 are saved at operation 324, the filter graphical user interface 70 is terminated at operation 320, and the method may end at 330. If "Delete Filter" is selected at operation 326, the selected filter name and the associated attributes 47 are deleted at operation 328 and the method loops back to evaluate the user input 98 at 302.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A computer program product adapted to run on a computer for interrogating data attributes in a product development environment, comprising:
   a product development application that includes an interrogate data selection device;
   the product development application including at least one of a computer aided design software application and a manufacturing software application;
   a product development datastore that stores attribute data associated with at least one of a part item and an annotation item created by the product development application;
   a data interrogator module that is initiated by the interrogate data selection device and that retrieves the attribute data associated with the at least one of the part item and the annotation item from the product development datastore;
   a graphical user interface manager module that displays the attribute data in a user customizable presentation;
   a filter module displayable on a display unit that generates a user customizable data filter through a corresponding filter graphical user interface, the filter module being adapted to filter attribute data stored in the product development datastore concerning at least one of the computer aided software application and the manufacturing software application, and to generate the retrieved attribute data for display on the graphical user interface manager module;
   the user customizable filter enabling a user to:
      create and save for future use a plurality of differing customized filters each having at least one specific attribute that can be associated with at least one of a part item and an annotation item; and
      to assign a specific filter name to each one of the customized filters; and
      wherein each one of the plurality of customized filters is displayed by its associated said filter name in a filter text box, from which a specific one of the customized filters may be selected by the user upon a selection by the user; and
   wherein the graphical user interface manager module exports the attribute data to an attribute file based on a predefined format.

2. The computer program product of claim 1 further comprising:
   wherein the data interrogator module retrieves the attribute data associated with the at least one of the part item and the annotation item based on the user customizable data filter.

3. The computer program product of claim 2, wherein the graphical user interface manager module initiates the filter graphical user interface based on a create filter command and wherein the filter module generates the user customizable data filter based on filter data commands received from the filter graphical user interface.

4. The computer program product of claim 1 wherein the graphical user interface manager module initiates an interrogate process graphical user interface based on a command generated by the interrogate selection device, and wherein the graphical user interface manager module displays the attribute data in the interrogate process graphical user interface.

5. The computer program product of claim 1 wherein the graphical user interface manager module receives at least one of a part item and an annotation item name from the product development application.

6. A computer implemented method of interrogating data attributes in a product development environment, comprising:
   initiating an interrogation process graphical user interface based on an interrogate command received from at least one of a computer assisted design application and a manufacturing application;
   retrieving attribute data associated with at least one of a part item and an annotation item from a product development datastore of at least one of the CAD application and the manufacturing application;
   displaying the attribute data in a user customizable presentation via the interrogation process graphical user interface;
   using a user customizable data filter accessible through a filter graphical user interface displayable on a display unit, and adapted to filter attribute data stored in the product development datastore, to generate the retrieved attribute data concerning one of the computer aided design application and the manufacturing application for presentation; and
   wherein said using a user customizable data filter further includes:
      enabling a user to create, and save for future use, a plurality of differing, user predefined data filters;
      enabling the user to assign at least one specific attribute to each of the differing, user predefined data filters that is associated with at least one of a part item and an annotation item; and
      enabling the user to assign a specific name to the customizable filter by which the user customizable filter can be retrieved by the user;
      causing the filter graphical user interface to display a selection device including a list of all of said differing user predefined data filters, by each said name associated with each said user predefined data filter;
      causing the filter graphical user interface to initiate a selected one of the plurality of predefined data filters; and
   exporting the attribute data to an attribute file based on a predefined format.

7. The method of claim 6 further comprising:
   wherein the retrieving the attribute data comprises retrieving the attribute data associated with the at least one of the part item and the annotation item based on the user customizable data filter.

8. The method of claim 7 further comprising:
   initiating the filter graphical user interface based on a create filter command; and
   wherein the generating the user customizable data filter is based on filter data commands received from the filter graphical user interface.

9. A product development system for use on a computer, comprising:
   a computer aided design (CAD) application used for designing at least one part item and assigning attribute data to the at least one part item wherein the CAD application includes an interrogate attribute selection device;

a datastore that stores the at lest one part item and the attribute data; and an interrogate data attribute module that is initiated by the interrogate attribute selection device and that interfaces with the CAD application to retrieve and display attribute data of the at least one part item from the datastore, for use by a user in operating said CAD application;

wherein the interrogate data attribute module generates a user customizable data filter accessible through a filter graphical user interface displayable on a display unit, and retrieves the attribute data associated with the at least one part item based on the user customizable data filter;

wherein the CAD application is used for designing at least one annotation item of the part item, wherein the data store stores attribute data of the at least one annotation item, and wherein the interrogate data attribute module interfaces with the CAD application to retrieve the attribute data of the at least one annotation item from the datastore; and the user customizable data filter including selections enabling a user to:

create and save for future use a plurality of user customized filters having at least one specific attribute that can be associated with at least one of a part item and an annotation item;

to assign a specific name to each one of the plurality of the customized filters; and to present a list of said plurality of user customized filters by the name assigned to each said customized filter in a selection device; and wherein the interrogate data attribute module exports the attribute data to an attribute file based on a predefined format.

10. The product development system of claim 9 further comprising:

a manufacturing application that includes an interrogate attribute selection device; and wherein the interrogate data attribute module is initiated by the interrogate attribute selection device of the manufacturing application and interfaces with the manufacturing application to retrieve the attribute data from the datastore.

11. The product development system of claim 9 wherein the interrogate data attribute module initiates the filter graphical user interface based on a create filter command, and wherein the interrogate data attribute module generates the user customizable data filter based on filter data commands received from the filter graphical user interface.

12. The product development system of claim 9 wherein the CAD application is used for designing the at least one part item of a mobile airborne platform.

13. A computer implemented method of interrogating data attributes in a product development environment, comprising:

selecting an interrogate attributes icon from at least one of a computer assisted design application and a manufacturing application;

selecting at least one of a part item and an annotation item from the at least one of the computer assisted design application and the manufacturing application;

retrieving attribute data associated with the at least one of the part item and an annotation item from a product development datastore being used in connection with the one of the computer aided design application and the manufacturing application;

displaying the attribute data in a user customizable presentation;

creating a customizable data filter accessible through a filter graphical user interface displayable on a display unit;

wherein the retrieving the attribute data comprises retrieving the attribute data associated with the at least one of the part item and the annotation item based on the customizable data filter; and wherein the creating a customizable data filter includes enabling a user to:

create and save for future use a plurality of customized filters each having at least one specific attribute that can be associated with at least one of a part item and an annotation item; and to assign a specific name to each one of the customized filters; and to call up a complete list of all available ones of said customized filters available from which a filter selection may be made; and wherein the interrogate data attribute module exports the attribute data to an attribute file based on a predefined format.

* * * * *